US010386415B2

(12) United States Patent
Nir et al.

(10) Patent No.: US 10,386,415 B2
(45) Date of Patent: Aug. 20, 2019

(54) MIXED-SIGNAL INTEGRATED CIRCUIT

(71) Applicant: Huawei Technologies Co., Ltd., Shenzhen (CN)

(72) Inventors: Udi Nir, Ottawa (CA); Zhaocai Lin, Shenzhen (CN); Tingting Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 171 days.

(21) Appl. No.: 15/705,558

(22) Filed: Sep. 15, 2017

(65) Prior Publication Data

US 2018/0003770 A1 Jan. 4, 2018

Related U.S. Application Data

(63) Continuation of application No. PCT/EP2015/055522, filed on Mar. 17, 2015.

(51) Int. Cl.
*G01R 31/3185* (2006.01)
*G06F 17/50* (2006.01)
(Continued)

(52) U.S. Cl.
CPC . *G01R 31/318536* (2013.01); *G01R 31/3167* (2013.01); *G01R 31/318583* (2013.01); (Continued)

(58) Field of Classification Search
CPC ........ G01R 31/318536; G01R 31/3167; G01R 31/318583; H03K 19/003; H03K 19/17748; G06F 17/5022
See application file for complete search history.

(56) References Cited

U.S. PATENT DOCUMENTS 5,568,493 A * 10/1996 Morris ............... G01R 31/3163
324/500
5,923,097 A * 7/1999 Corriveau .......... G01R 31/2884
307/29
(Continued)

FOREIGN PATENT DOCUMENTS

CN 1305112 A 7/2001
CN 101738580 A 6/2010
(Continued)

OTHER PUBLICATIONS

Zjajo, A. et al., "Power-Scan Chain: Design for Analog Testability," International Test Conference, Paper 4.3, Nov. 8-10, 2005, 8 pages.
(Continued)

*Primary Examiner* — Naum Levin
(74) *Attorney, Agent, or Firm* — Slater Matsil, LLP

(57) ABSTRACT

A mixed-signal integrated circuit includes an analog circuit comprising at least one digital block embedded in the analog circuit, the at least one digital block comprising a plurality of functional bits and a plurality of configuration bits, the plurality of functional bits providing for a functionality of the analog circuit according to a designed functionality and the plurality of configuration bits being usable for configuring a plurality of operational modes of the analog circuit; and a digital circuit comprising a scan chain configured to scan at least part of the functional bits of the digital block embedded in the analog circuit with respect to the designed functionality, wherein the scan chain is further configured to set at least part of the configuration bits of the digital block embedded in the analog circuit according to a selected operational mode of the plurality of operational modes of the analog circuit.

15 Claims, 6 Drawing Sheets

(51) Int. Cl.
  *H03K 19/177* (2006.01)
  *H03K 19/003* (2006.01)
  *G01R 31/3167* (2006.01)

(52) U.S. Cl.
  CPC ....... *G06F 17/5022* (2013.01); *H03K 19/003* (2013.01); *H03K 19/17748* (2013.01)

(56) References Cited

U.S. PATENT DOCUMENTS

| | | | |
|---|---|---|---|
| 6,614,260 B1 | 9/2003 | Welch et al. | |
| 6,931,579 B2* | 8/2005 | Roberts | G01R 31/3167 702/108 |
| 7,032,151 B2* | 4/2006 | Halder | G01R 31/3167 714/727 |
| 7,155,646 B2* | 12/2006 | Whetsel | G01R 31/318544 714/726 |
| 7,191,373 B2* | 3/2007 | Wang | G01R 31/31704 714/729 |
| 7,225,374 B2* | 5/2007 | Burdine | G01R 31/318569 714/726 |
| 7,671,618 B2* | 3/2010 | Zjajo | G01R 31/3167 324/750.3 |
| 8,310,265 B2* | 11/2012 | Zjajo | G01R 31/318558 324/750.3 |
| 8,499,208 B2* | 7/2013 | Dieffenderfer | G01R 31/3187 714/733 |
| 8,904,333 B2* | 12/2014 | Bai | G06F 17/5054 716/112 |
| 9,081,063 B2* | 7/2015 | Narayanan | G01R 31/3004 |
| 9,188,642 B2* | 11/2015 | Gulati | G11C 29/36 |
| 9,664,740 B2* | 5/2017 | Shrivastava | G01R 31/318516 |
| 2013/0285739 A1* | 10/2013 | Blaquiere | G01R 31/318555 327/565 |

FOREIGN PATENT DOCUMENTS

| | | |
|---|---|---|
| CN | 102809934 A | 12/2012 |
| CN | 103916102 A | 7/2014 |
| WO | 2015027023 A1 | 2/2015 |

OTHER PUBLICATIONS

Yang, S. et al, "Research and Application of Testability based on Full-Scan Technology," China Integrated Circuit, 08-2014, 4 pages.

* cited by examiner

200c

MIXED-SIGNAL INTEGRATED CIRCUIT

CROSS-REFERENCE TO RELATED APPLICATIONS

This application is a continuation of International Application No. PCT/EP2015/055522, filed on Mar. 17, 2015, the disclosure of which is hereby incorporated by reference in its entirety.

TECHNICAL FIELD

The present disclosure relates to a mixed-signal integrated circuit (IC) and a method for operating such mixed-signal integrated circuit. The present disclosure particularly relates to usage of Design-for-Test automatic scan chain insertion as functional programing interface of static registers in peripheral analog units.

BACKGROUND

In mixed-signal ICs the analog units are composed of embedded digital blocks which are used to time some delicate analog behavior as switched capacitors, current/voltage sources and amplifiers. Such digital blocks may have many configuration bits enabling a controlled functionally of these blocks. In array based analog units such as analog-to-digital converters (ADCs), imagers, sensors and phase arrays, the total amount of configurable bits can exceed several thousands.

The controlled bits are accessed by on chip/remote host which can configure them according to the required mode of operation. The problem is that being embedded inside the analog unit, which is designed by custom layout engineers, every bit requires manual stretching of wires from the embedded block to the interface of analog and the digital units. From this point, the signal is routed automatically by the P&R (Place and Route) tools.

To date, there are several solutions to avoid this huge amount of wiring, such as SPI (Serial Periphery Interface) or Parallel CPU I/F (Central Processing Unit Interface). These solutions reduce the burden from the layout designer, but have some penalty in resources, IC area and power. The interface needs to be designed and integrated; the interface adds to the analog unit area and power.

There is a need to provide a mixed-signal integrated circuit without such penalty in resources, IC area and power.

SUMMARY

It is the object of the embodiments of the invention to provide a flexibly configurable mixed-signal integrated circuit having an improved layout with respect to resources, IC area and power.

This object is achieved by the features of the independent claims. Further implementation forms are apparent from the dependent claims, the description and the figures.

Embodiments of the present invention are based on the idea to use an automatic scan chain insertion which is introduced anyway in digital design flow, instead of adding a generic interface, to program static bits in peripheral analog units.

By using the Design-for-Test automatically inserted scan chain to program the control bits of the analog unit saves power and area. In modern mass production IC, scan chain insertion is used anyway for automatic testing of the Die. The flow of the scan insertion and verification may be done automatically by EDA (Electronic Design Automation) tools, and doesn't require the same resources as for the existing interfaces. In order to use the scan chain to program only the configuration bits and not the functional bits of the digital blocks in the analog units, a mux may be added in the scan insertion flow to bypass the functional registers in programing time. This bypass may be disabled in DFT (Design for Test) mode. By adding a small amount of sequential logic in the digital side, the CPU can activate the scan chain to program the peripheral analog units registers. Scan chain programming is relatively slow, but since static registers are usually updated once after chip reset, a programming time of about eons/bit or about 200 us for 10K bit can be neglected.

By using the automatic scan chain insertion to program static bits in peripheral analog units, the automation of analog macro design can be increased. By using the automatic scan chain insertion to program static bits in peripheral analog units, there is no need to design a special interface for the programming of digital blocks registers, embedded inside analog macros. Area and power are reduced since very few cells are required to be added to enable the register programming interface.

In order to describe the embodiments of the present invention in detail, the following terms, abbreviations and notations will be used:
IC: Integrated Circuit
ADC: Analog-to-Digital Converter
DAC: Digital-to-Analog Converter
P&R: Place and Route
CPU: Central Processing Unit
I/F: interface
SPI: Serial Periphery Interface
EDA: Electronic Design Automation
DFT: Design for Test According to a first aspect, the embodiments of the present invention relate to a mixed-signal integrated circuit. The mixed-signal integrated circuit includes an analog circuit comprising at least one digital block embedded in the analog circuit, the at least one digital block comprising a plurality of functional bits and a plurality of configuration bits, the plurality of functional bits providing for a functionality of the analog circuit according to a designed functionality and the plurality of configuration bits being usable for configuring a plurality of operational modes of the analog circuit. The mixed-signal integrated circuit also includes a digital circuit comprising a scan chain configured to scan at least part of the functional bits of the digital block embedded in the analog circuit with respect to the designed functionality, wherein the scan chain is further configured to set at least part of the configuration bits of the digital block embedded in the analog circuit according to a selected operational mode of the plurality of operational modes of the analog circuit.

Such a mixed-signal integrated circuit where the scan chain is configured to set at least part of the configuration bits of the digital block provides a flexibly configurable mixed-signal integrated circuit having an improved layout with respect to resources, IC area and power.

In a first possible implementation form of the mixed-signal integrated circuit according to the first aspect, the scan chain is configured to scan the at least part of the functional bits of the digital block when the scan chain is in a Design-for-Test mode and to set the at least part of the configuration bits of the digital block when the scan chain is in a Functional-Scan mode.

Such a mixed-signal integrated circuit provides flexibility for both performing scanning the functional bits and setting the configuration bits.

In a second possible implementation form of the mixed-signal integrated circuit according to the first implementation form of the first aspect, the mixed-signal integrated circuit comprises a scan chain interface between the analog circuit and the digital circuit, wherein the scan chain is configured to use the scan chain interface in both modes, the Design-for Test mode and the Functional-Scan mode.

When using the scan chain interface in both modes no extra interface is needed thereby reducing layout design costs.

In a third possible implementation form of the mixed-signal integrated circuit according to the first implementation form or the second implementation form of the first aspect, the scan chain comprises a multiplexer configured to bypass the functional bits of the digital block when the scan chain is in the Functional-Scan mode.

The setting the configuration bits can be realized by adding a single multiplexer to bypass the functional bits scanning of a common scan chain. Therefore no expensive analog circuits are required, just a simple change in the digital block of the analog circuit is sufficient thereby improving the layout of the mixed-signal IC with respect to resources, IC area and power.

In a fourth possible implementation form of the mixed-signal integrated circuit according to the third implementation form of the first aspect, the scan chain is configured to set the multiplexer disabling the bypassing of the functional bits when the scan chain is in the Design-for Test mode.

The multiplexer can be controlled by a simple control command for switching the mixed-signal integrated circuit between DFT mode and Functional-Scan mode.

In a fifth possible implementation form of the mixed-signal integrated circuit according to the first implementation form or the second implementation form of the first aspect, the scan chain comprises an input for receiving a Functional-Scan enable signal, the Functional-Scan enable signal activating the Functional-Scan mode of the scan chain.

A simple control signal is sufficient to control activation of the Functional-Scan mode thereby saving chip resources, area and power.

In a sixth possible implementation form of the mixed-signal integrated circuit according to the fifth implementation form of the first aspect, the digital circuit comprises an activation circuit configured to activate the Functional-Scan mode in the scan chain upon reception of the Functional-Scan enable signal.

A simple digital activation circuit may be used to activate the Functional-Scan mode. This activation circuit can be implemented by using small chip area and it requires only a small power.

In a seventh possible implementation form of the mixed-signal integrated circuit according to the sixth implementation form of the first aspect, the activation circuit is configured to activate the Functional-Scan mode in the scan chain once after a reset of the mixed-signal integrated circuit.

By using such activation circuit at each chip reset a new configuration of the mixed-signal IC can be set. The configuration of such mixed-signal IC is therefore not limited to factory tests, the IC can also be configured in the field.

In an eighth possible implementation form of the mixed-signal integrated circuit according to any of the fifth to the seventh implementation forms of the first aspect, the scan chain comprises a state machine configured to control the setting of the at least part of the configuration bits of the digital block.

By using the state machine also complex configurations can be implemented.

In a ninth possible implementation form of the mixed-signal integrated circuit according to the eighth implementation form of the first aspect, the state machine is activated based on the Functional-Scan enable signal.

When the state machine is activated based on the Functional-Scan enable signal it may run only during the Functional-Scan mode and can be switched off when the scan chain is not in the Functional-Scan mode thereby saving power.

In a tenth possible implementation form of the mixed-signal integrated circuit according to any of the fifth to the ninth implementation forms of the first aspect, the scan chain comprises a shift register storing data to be set to the at least part of the configuration bits of the digital block.

Such a shift register can be used to load the individual configuration bits in a very efficient manner. At each operation cycle a new configuration bit can be set. Therefore configuration can be performed very fast.

In an eleventh possible implementation form of the mixed-signal integrated circuit according to the tenth implementation form of the first aspect, the scan chain is configured to shift out one bit of the shift register in each operation cycle to the at least part of the configuration bits of the digital block.

When one bit of the shift register is shifted out in each operation cycle to the configuration bits, configuration of the mixed-signal IC is very fast.

In a twelfth possible implementation form of the mixed-signal integrated circuit according to the eleventh implementation form of the first aspect, the shift register is initialized based on the Functional-Scan enable signal.

When the shift register is initialized based on the Functional-Scan enable signal, initialization can be performed during runtime of the IC, e.g. when the scan chain is not in the Functional-Scan mode. This enables initialization of the configuration bits in the field.

In a thirteenth possible implementation form of the mixed-signal integrated circuit according to the first aspect as such or according to any of the preceding implementation forms of the first aspect, the analog circuit comprises at least one of the following units: switched capacitors, current sources, voltage sources, amplifiers.

When the analog circuit comprises such devices, the chip can be applied for both high voltage and low voltage applications in a very resource efficient manner, e.g. in 3G or 4G cell phones, delta-sigma modulators, A/D converters, D/A converters, digital radio chips, sound chips, LAN and WAN router chips, media players, etc.

In a fourteenth possible implementation form of the mixed-signal integrated circuit according to any of the preceding implementation forms of the first aspect, a clocking of the scan chain is the same when the scan chain is in Functional-Scan mode and when the scan chain is in Design-for-Test mode.

In Functional-Scan mode only the configuration bits may be scanned while Design-for-Test mode both, functional bits and configuration bits may be scanned. This can be performed by using the same clock thereby saving hardware resources.

According to a second aspect, the embodiments of the present invention relate to a method for operating a mixed-signal integrated circuit. The mixed-signal integrated circuit comprises an analog circuit comprising at least one digital block embedded in the analog circuit, the at least one digital block comprising a plurality of functional bits and a plurality of configuration bits, the plurality of functional bits providing for a functionality of the analog circuit according to a designed functionality and the plurality of configuration bits being usable for configuring a plurality of operational modes of the analog circuit. The mixed-signal integrated circuit also comprises a digital circuit comprising a scan chain. The method comprises scanning at least part of the functional bits of the digital block embedded in the analog circuit with respect to the designed functionality by using the scan chain. The method also comprises setting at least part of the configuration bits of the digital block embedded in the analog circuit according to a selected operational mode of the plurality of operational modes of the analog circuit by using the scan chain.

Such a method provides a flexibly configurable operation of a mixed-signal IC thereby saving resources, IC area and power.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

The devices and methods described herein may be based on mixed-signal integrated circuits. A mixed-signal integrated circuit is any integrated circuit that has both analog circuits and digital circuits on a single semiconductor die. Integrated Circuits (ICs) are generally classified as digital (i.e., microprocessors, etc.) or analog (i.e., operational amplifiers, etc.). Mixed-signal ICs are chips that contain both digital and analog circuits on the same chip.

The methods and devices described herein may be implemented for producing mixed-signal integrated circuits, e.g. semiconductor chips. The described devices and systems may include integrated circuits and/or passives and may be manufactured according to various technologies. For example, the circuits may include logic integrated circuits, analog integrated circuits, mixed signal integrated circuits, optical circuits, memory circuits and/or integrated passives.

In the following description methods and devices using scan chains are described. Scan chain is a technique that is used in design for testing. The objective is facilitate testing by providing an easy way to set and observe every flip-flop in an integrated circuit. The basic structure of a scan chain may include the following set of signals in order to control and observe the scan mechanism. Scan_in and scan_out define input and output of the scan chain. In a full scan mode usually each input drives only one chain and scan out observes one as well. A scan enable pin is a special signal that is added to a design. When this signal is asserted, every flip-flop in the design is connected into a shift register. A Clock signal is used for controlling all the flip-flops (FFs) in the chain during shift phase and the capture phase. An arbitrary pattern can be entered into the chain of flip-flops, and the state of every flip-flop can be read out.

Figure 1:
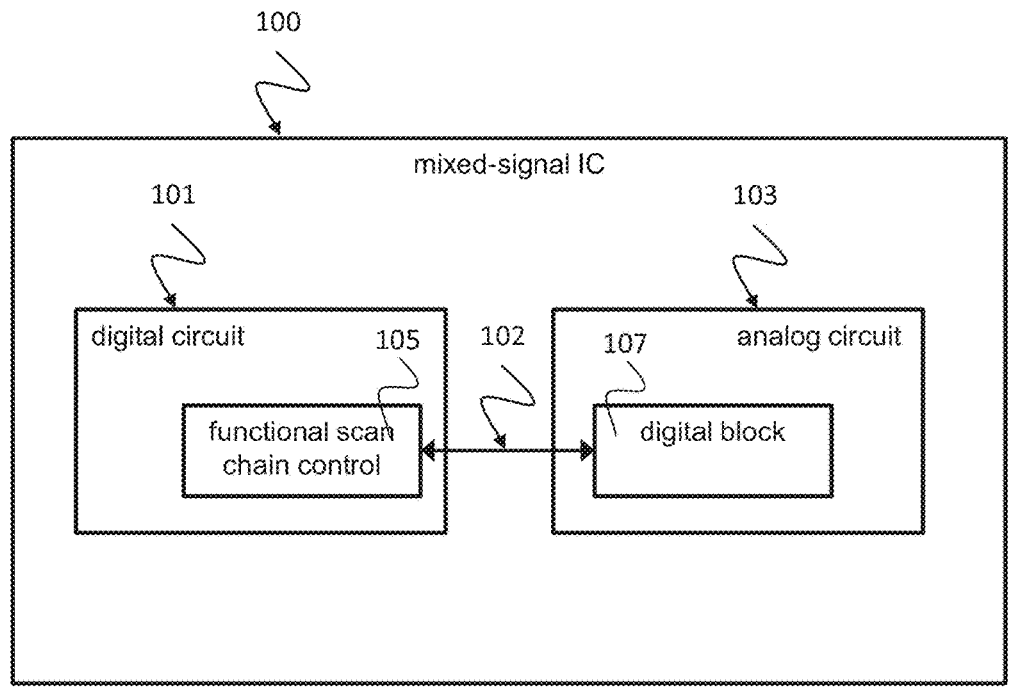
FIG. 1 shows a block diagram illustrating the architecture of a mixed-signal integrated circuit 100 according to an implementation form.

FIG. 1 shows a block diagram illustrating the architecture of a mixed-signal integrated circuit 100 according to an implementation form. The mixed-signal integrated circuit 100 includes an analog circuit 103 and a digital circuit 101. The analog circuit 103 includes at least one digital block 107 embedded in the analog circuit 103. The at least one digital block 107 includes a plurality of functional bits 301 and a plurality of configuration bits 303, e.g. as described below with respect to FIG. 3. The plurality of functional bits 301 provide for a functionality of the analog circuit 103 according to a designed functionality. The configuration bits 303 are usable for configuring a plurality of operational modes of the analog circuit 103. The digital circuit 101 includes a functional scan chain control 105 configured to scan at least part of the functional bits 301 of the digital block 107 with respect to the designed functionality. The functional scan chain control 105 is further configured to set at least part of the configuration bits 303 of the digital block 107 according to a selected operational mode of the plurality of operational modes of the analog circuit 103. The functional scan chain control 105 may be used to control the scan chain that may be implemented in the digital block inside the analog circuit.

The functional scan chain control 105 may scan all or some of the functional bits 301 of the digital block 107 when the functional scan chain control 105 is in a Design-for-Test mode and may set all or some of the configuration bits 303 of the digital block 107 when the functional scan chain control 105 is in a Functional-Scan mode. The mixed-signal integrated circuit 100 may include a scan chain interface 102 between the analog circuit 103 and the digital circuit 101. The functional scan chain control 105 may use the scan chain interface 102 in both modes, the Design-for Test mode and the Functional-Scan mode.

The functional scan chain control 105 may include a multiplexer 205, e.g. as described below with respect to FIG. 2a to bypass the functional bits 301 of the digital block 107 when the scan chain 105, 200a is in the Functional-Scan mode. The functional scan chain control 105 may set the multiplexer 205 disabling the bypassing of the functional bits 301 when the functional scan chain control 105 is in the Design-for Test mode. The functional scan chain control 105 may include an input for receiving a Functional-Scan enable signal F7, e.g. as described below with respect to FIGS. 2a to 2c. The Functional-Scan enable signal F7 may activate the Functional-Scan mode of the scan chain 105.

The digital circuit 101 may include an activation circuit 211, e.g. as described below with respect to FIG. 2a to activate the Functional-Scan mode in the functional scan chain control 105 upon reception of the Functional-Scan enable signal F7. The activation circuit 211 may activate the Functional-Scan mode in the functional scan chain control 105 once after a reset of the mixed-signal integrated circuit 100. The functional scan chain control 105 may include a state machine 209, e.g. as described below with respect to FIG. 2a to control the setting of all or some of the configuration bits 303 of the digital block 107. The state machine 209 may be activated based on the Functional-Scan enable signal F7.

The functional scan chain control 105 may include a shift register 203, e.g. as described below with respect to FIG. 2a that may be used for storing data to be set to the configuration bits 303 of the digital block 107. The functional scan chain control 105 may shift out one bit of the shift register 203 in each operation cycle to the configuration bits 303 of the digital block 107. The shift register 203 may be initialized based on the Functional-Scan enable signal F7.

The analog circuit 103 may include switched capacitors, current sources, voltage sources and/or amplifiers, etc.

Figure 2A:
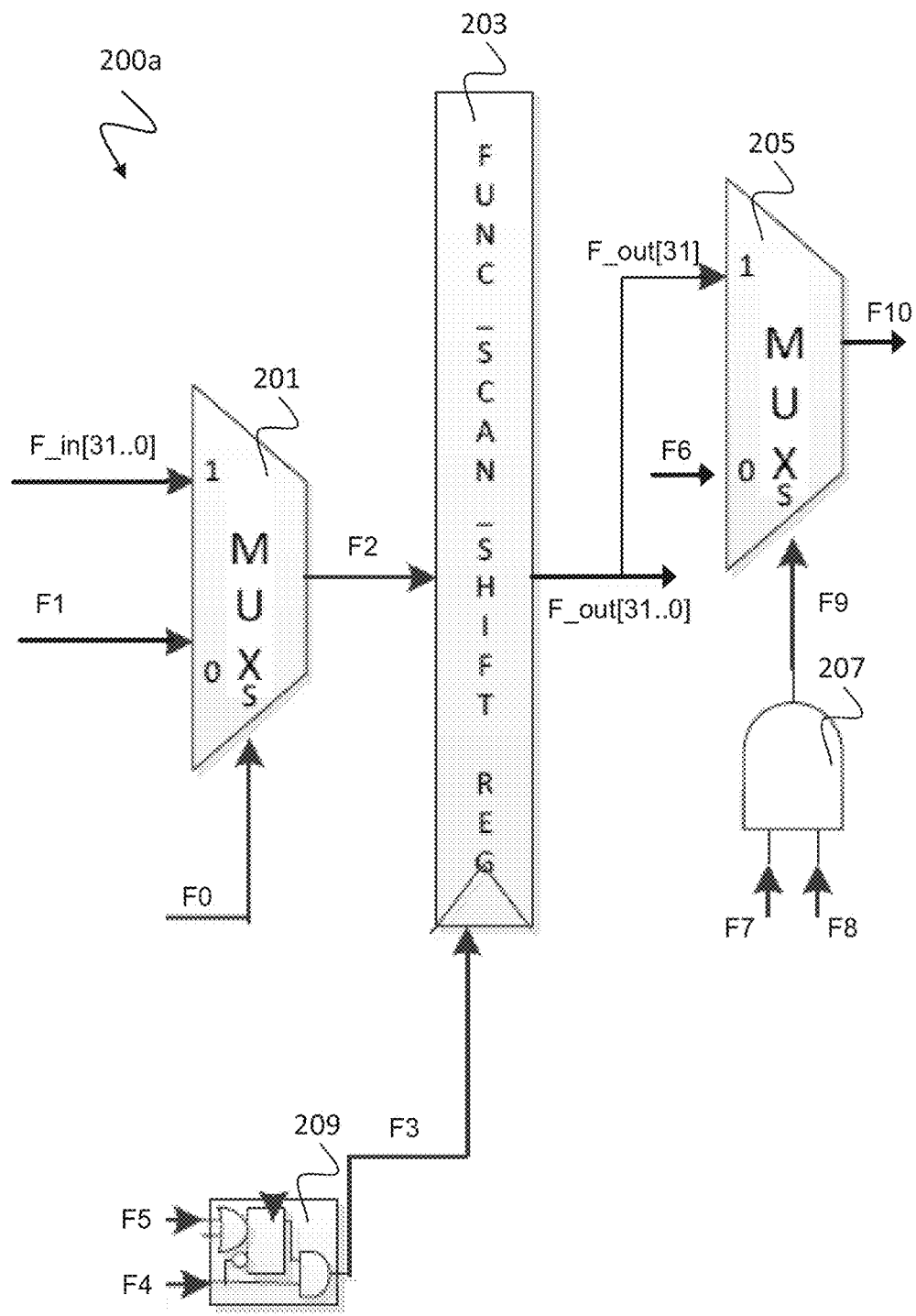
FIGS. 2a, 2b and 2c show block diagrams illustrating the architecture of parts of a scan chain 200a, 200b, 200c of a mixed-signal integrated circuit according to an implementation form.
Figure 2B:
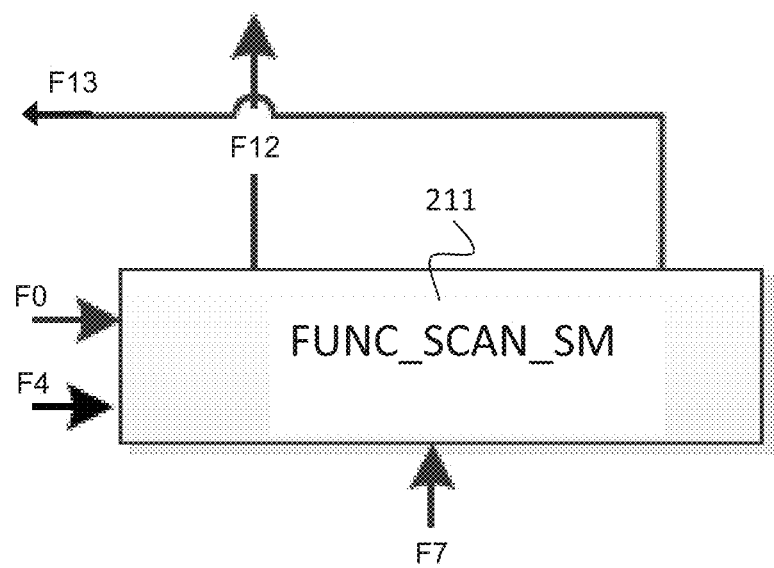
Figure 2C:
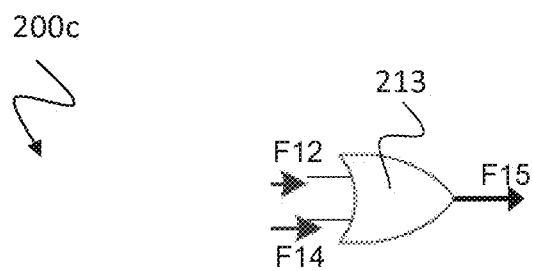
Figure 2C:
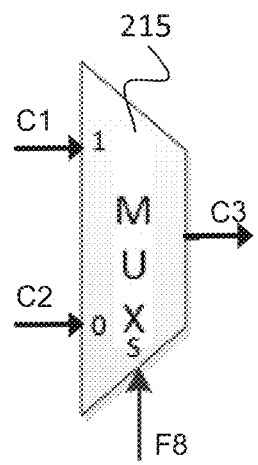
Figure 2C:
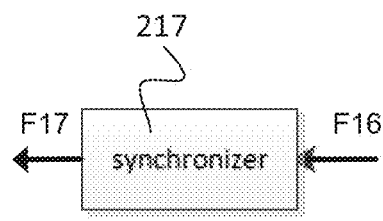

FIGS. 2a, 2b and 2c show block diagrams illustrating the architecture of parts of a scan chain 200a, 200b, 200c of a mixed-signal integrated circuit, e.g. a mixed-signal integrated circuit 100 as described above with respect to FIG. 1 according to an implementation form.

The parts of a scan chain 200a, 200b, 200c illustrated in FIGS. 2a to 2c may be employed in a mixed signal chip with analog macro and digital controller, e.g. a mixed signal chip or mixed-signal integrated circuit 100 as described above with respect to FIG. 1 including an analog macro or analog circuit 103 and a digital controller or digital circuit 101. The analog macro 103 may have small configuration register files, which may be connected to each other using an automatically inserted scan chain for DFT purposes, e.g. as described below with respect to FIG. 3. The analog macro scan chain signals may be connected to the DFT macro and also to a block in the digital controller domain also referred to as FUNC_SCAN_BLOCK 200a, 200b, 200c as depicted in FIGS. 2a, 2b, 2C.

The main components of the scan chain or FUNC_SCAN_BLOCK 200a, 200b, 200c are depicted in FIG. 2a, while FIGS. 2b and 2c illustrate further components which may be required for the functionality of the scan chain. The components of the scan chain 200a, 200b, 200c depicted in FIGS. 2a to 2c are exemplary components that may be used for forming a scan chain, e.g. a functional scan chain control 105 as described above with respect to FIG. 1.

The parts of the scan chain 200a as illustrated in FIG. 2a may include a first multiplexer 201, a shift register 203, a second multiplexer 205, an AND logic block 207, i.e. a logic block performing an AND operation, and a state machine circuit 209.

The first multiplexer 201 may receive a first input signal F_in[31.0] at its first input referred to as "1". The first input signal F_in[31.0] may be a signal vector of 32 bit signal width. Instead of 32 bit signal width any other power of two may be used as signal width. The first multiplexer 201 may receive a second input signal F1 at its second input referred to as "0". The first multiplexer 201 may be controlled by a control signal F0 producing an output signal F2.

The signal F_in[31.0] may also be referred to as Func_scan_shift_in[31.0] or input shift signal of the functional scan. The signal F1 may also be referred to as {func_scan_shift_out<<1,dft_adc_a_scan_so_z} or output shift signal of the functional scan "func_scan_shift_out" shifted by 1 bit and set to DFT mode scan A/D serial out signal "dft_adc_a_scan_so_z" at the shifted bit position. The signal F0 may also be referred to as func_scan_start or functional scan start signal.

The shift register 203 may store the output signal F2 of the first multiplexer 201 and produce an output signal F_out [31.0] based on a shifted version of F2, wherein the shifting may be controlled by a control signal F3 that represents an output signal of the state machine circuit 209. The most significant bit F_out[31] of the output signal F_out[31.0] may be provided to the first input referred to as "1" of the second multiplexer 205. The second multiplexer 205 may receive a second input signal F6 at its second input referred to as "0". The second multiplexer 205 may be controlled by a control signal F9 to produce an output signal F10. The control signal F9 may be an output of the AND logic block 207 that performs a logic AND operation on the two input signals F7 and F8 received at its two inputs.

The signal F_out[31.0] may also be referred to as func_scan_shift_out[31.0] or output shift signal of the functional scan. The signal F6 may also be referred to as dft_dac_a_scan_si or DFT mode scan D/A serial in signal. The signal F10 may also be referred to as da_dft_dac_a_scan_si or DA DFT mode scan D/A serial in signal. The signal F7 may also be referred to as func_scan_en or Functional-Scan mode enable signal. The signal F8 may also be referred to as dft_mode or DFT mode signal.

The state machine circuit 209 may implement a state machine of the scan chain 200a, 200b, 200c. The state machine circuit 209 may receive a first external signal F4 and a second external signal F5 and may provide the output signal F3 to the shift register 203. The signal F4 may correspond to the clock signal C2 (clk_mm) divided by 16 as described below with respect to FIG. 2C.

The signal F4 may also be referred to as clk_mm_d16_func_scan or Functional-Scan mode clock signal. The signal F5 may also be referred to as {func_scan_start|func_scan_shift} or Functional-Scan mode start signal concatenated with Functional-Scan mode shift signal.

The parts of the scan chain 200b as illustrated in FIG. 2b may include an activation circuit 211 to activate the scanning, in particular the shifting of the shift register 203 by providing the output signal F12 based on a first input signal F0, a second input signal F4 and a third input signal F7. F0 may correspond to the control signal F0 of the first multiplexer 201. F4 may correspond to the first external signal F4 of the state machine circuit 209. F7 may correspond to the first input signal F7 of the AND logic block 207. The activation circuit 211 may provide a second output signal F13.

The signal F12 may also be referred to as func_scan_shift or Functional-Scan mode shift signal. The signal F13 may also be referred to as func_scan_done or Functional-Scan mode done signal.

The parts of the scan chain 200c as illustrated in FIG. 2c may include a NOR logic block 213, i.e. a logic block performing a NOR operation. The NOR logic block 213 performs a NOR logic operation on the two input signals F12 and F14 received at its first and second input and provides an output signal F15. F12 may correspond to the output signal F12 of the activation circuit 211.

The signal F14 may also be referred to as dft_dac_a_scan_se or DFT mode D/A scan serial enable signal. The signal F15 may also be referred to as da_dft_dac_a_scan_se or DA DFT mode D/A scan serial enable signal.

The parts of the scan chain 200c as illustrated in FIG. 2c may include a third multiplexer 215. The third multiplexer 215 may receive a first input signal C1 at its first input referred to as "1". The third multiplexer 215 may receive a second input signal C2 at its second input referred to as "0". The second multiplexer 215 may be controlled by a control signal F8 to produce an output signal C3. The control signal F8 may correspond to the second input signal F8 of the AND logic block 207.

The signal C1 may also be referred to as clk_mm_d16_func_scan or Functional-Scan mode clock signal or clock signal divided by 16. The signal C2 may also be referred to as Clk_mm or clock signal. The signal C3 may also be referred to as da_dft_dac_a_scan_clk or DFT mode clock signal.

The parts of the scan chain 200c as illustrated in FIG. 2c may include a synchronizer circuit 217 receiving an input signal F16 and providing an output signal F17 based on a synchronization of the input signal F16.

The signal F16 may also be referred to as da_dft_adc_a_scan_so or DFT mode DA A/D scan serial out signal. The signal F17 may also be referred to as dft_adc_a_scan_so_z or DFT mode A/D scan serial out signal.

The functionality of the parts of the scan chain 200a, 200b, 200c depicted in FIGS. 2a, 2b, 2c may be described as follows.

In order to activate the functional scan in the CPU may write to three registers: FUNC_SCAN_SHIFT_IN (F_IN [31.0])—32 bits of data to be scanned to the analog macro; FUNC_SCAN_EN (F7 or func_scan_en or Functional-Scan mode enable signal)—enable the scan chain to be driven by the digital block rather than the DFT macro; and FUNC_SCAN_START (F0 or func_scan_start or functional scan start signal)—activate the functional scan state machine (DAC_FS_SM, 209) and initialize the FUNC_SCAN_SHIFT register 203.

In the next cycle, the FUNC_SCAN_SHIFT signal may be driven high, and may enable left shift of the FUNC_SCAN_SHIFT register. Bit 31 of this register may be driving the output bit DA_DFT_DAC_A_SCAN_SI. Every cycle of clk_mm_d16_func_csan clock 1 bit may be shifted out through this pin. The process may complete after all the 32 bits have been shifted out into the analog macro scan chain. The CPU may load the next 32 bits and may repeat the process until all bits of the analog macro have been set.

Figure 3:
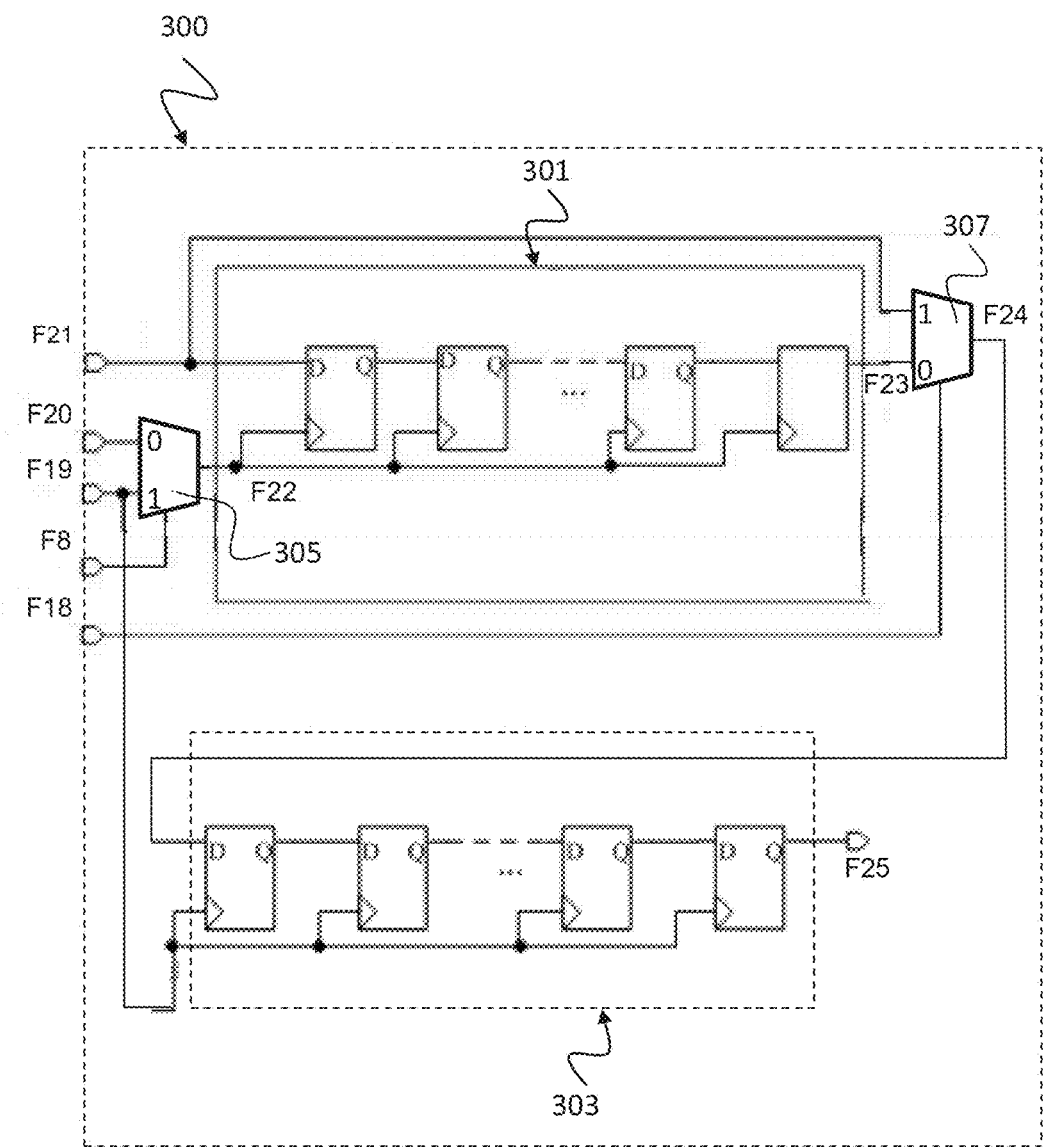
FIG. 3 shows a block diagram illustrating an exemplary part of a digital block 300 embedded in the analog circuit of a mixed-signal integrated circuit according to an implementation form.

FIG. 3 shows a block diagram illustrating an exemplary part of a digital block 300 embedded in the analog circuit of a mixed-signal integrated circuit, e.g. a mixed-signal integrated circuit 100 as described above with respect to FIG. 1 according to an implementation form. The digital block 300 may correspond to the digital block 107 described above with respect to FIG. 1.

The digital block 300 may include a plurality of functional bits 301, e.g. forming a functional register, a plurality of configuration bits 303, e.g. forming a configuration register, a first multiplexer 305 and a second multiplexer 307. The plurality of functional bits 301 may provide for a functionality of the analog circuit according to a designed functionality. The plurality of configuration bits 303 may be usable for configuring a plurality of operational modes of the analog circuit. The plurality of functional bits 301 may be implemented by flip-flops, e.g. D flip-flops or Q flip-flops. The plurality of configuration bits 303 may be implemented by flip-flops, e.g. D flip-flops or Q flip-flops. In one example the digital block 300 may include a number of about 70 functional bits 301 and a number of about 180 configuration bits 303.

The functional register 301 that may correspond to the plurality of functional bits may receive an input signal F21 that may be stored in the functional register 321 based on a clock signal F22. The input signal F21 may also be provided to the second multiplexer 307 at its first input referred to as "1". The clock signal F22 may be the output signal of the first multiplexer 305 that may receive a first signal F20 at its first input referred to as "0" and a second signal F19 at its second input referred to as "1". The first multiplexer 305 may be controlled by the signal F8 that may correspond to the second input signal F8 of the AND logic block 207 depicted in FIG. 2a. The functional register 301 may provide an output signal F23 at its output that may be provided to the second input referred to as "0" of the second multiplexer 307. The second multiplexer 307 may provide an output signal F24 by multiplexing the first input signal F21 with the second input signal F23 based on a control signal F18.

The configuration register 303 that may correspond to the plurality of configuration bits may receive an input signal F24 corresponding to the output signal F24 of the second multiplexer 307. F24 may be stored in the configuration register 323 based on a clock signal F19 that may correspond to the second signal F19 at the second input of the first multiplexer 305. The configuration register 303 may provide an output signal F25.

The signal F18 may also be referred to as func_scan_mode. The signal F19 may also be referred to as dft_clk. The signal F20 may also be referred to as clk_smg. The signal F21 may also be referred to as dft_scan_si. The signal F25 may also be referred to as dft_so.

The second multiplexer 307 may represent the one MUX cell that needs to be added to the standard scan chain employed in the configuration register files of the analog macro, to enable scan-in of the configuration bits only during the functional scan mode.

In the mixed-signal circuit depicted in FIG. 3 the analog macro may have embedded register files. The embedded register files may be chained with automatic DFT scan chain bits. The analog macro programing interface may be performed via the DFT scan chain.

Figure 4:
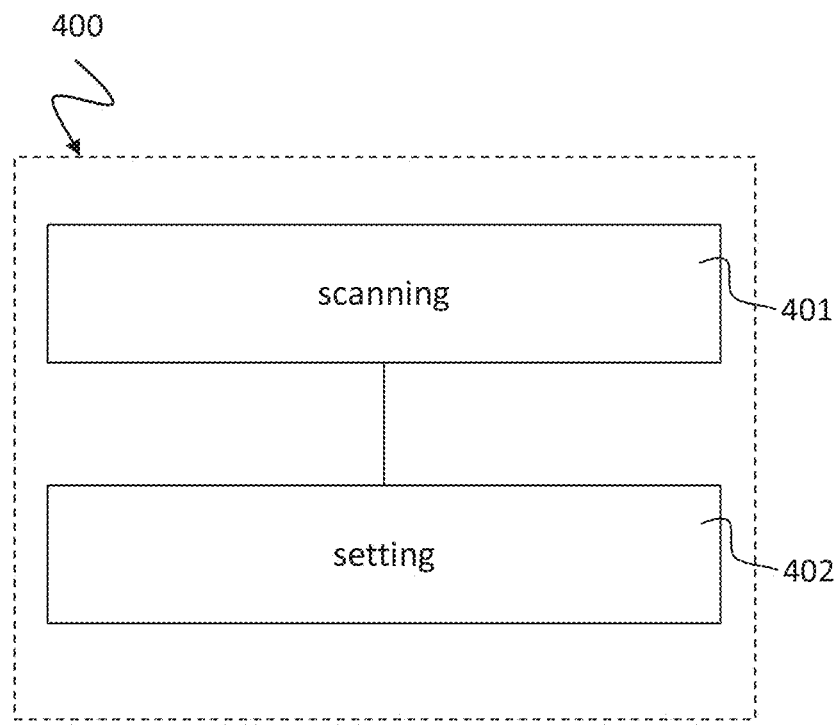
FIG. 4 shows a schematic diagram illustrating a method 400 for operating a mixed-signal integrated circuit according to an implementation form.

FIG. 4 shows a schematic diagram illustrating a method 400 for operating a mixed-signal integrated circuit according to an implementation form.

The method 400 may be applied for operating a mixed-signal integrated circuit, e.g. a mixed-signal integrated circuit as described above with respect to FIGS. 1 to 3. The mixed-signal integrated circuit may include an analog circuit and a digital circuit. The analog circuit may include at least one digital block embedded in the analog circuit. The at least one digital block may include a plurality of functional bits and a plurality of configuration bits. The plurality of functional bits may provide for a functionality of the analog circuit according to a designed functionality. The plurality of configuration bits may be used for configuring a plurality of operational modes of the analog circuit. The digital circuit may include a scan chain, e.g. a scan chain as described above with respect to FIGS. 2a to 2c.

The method 400 includes scanning 401 at least part of the functional bits of the digital block embedded in the analog circuit with respect to the designed functionality by using the scan chain. The method 400 includes setting 402 at least part of the configuration bits of the digital block embedded in the analog circuit according to a selected operational mode of the plurality of operational modes of the analog circuit by using the scan chain.

The methods, systems and devices described herein may be implemented as optical or electronic circuits within a chip or an integrated circuit or an application specific integrated circuit (ASIC). The embodiments of the present invention can be implemented in digital and/or analogue electronic and optical circuitry.

The present disclosure also supports a computer program product including computer executable code or computer executable instructions that, when executed, causes at least one computer to execute the performing and computing steps described herein, in particular the method 400 as described above with respect to FIG. 4 and the techniques described above with respect to FIGS. 1 to 3. Such a computer program product may include a readable storage medium storing program code thereon for use by a computer. The program code may perform the method 400 as described above with respect to FIG. 4.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A mixed-signal integrated circuit, comprising:
   an analog circuit, comprising:
      a digital block embedded in the analog circuit, the digital block comprising a plurality of functional bits and a plurality of configuration bits, the plurality of functional bits providing for a functionality of the analog circuit according to a designed functionality and the plurality of configuration bits being usable for configuring a plurality of operational modes of the analog circuit; and
   a digital circuit, comprising a scan chain, configured to:
      scan part of the functional bits of the digital block embedded in the analog circuit with respect to the designed functionality; and
      set part of the configuration bits of the digital block embedded in the analog circuit according to a selected operational mode of the plurality of operational modes of the analog circuit.

2. The mixed-signal integrated circuit of claim 1, wherein the scan chain is configured to scan the part of the functional bits of the digital block when the scan chain is in a Design-for-Test mode and to set the part of the configuration bits of the digital block when the scan chain is in a Functional-Scan mode.

3. The mixed-signal integrated circuit of claim 2, further comprising:
   a scan chain interface between the analog circuit and the digital circuit, wherein the scan chain is configured to use the scan chain interface in both the Design-for Test mode and the Functional-Scan mode.

4. The mixed-signal integrated circuit of claim 2, wherein the scan chain comprises a multiplexer configured to bypass the functional bits of the digital block when the scan chain is in the Functional-Scan mode.

5. The mixed-signal integrated circuit of claim 4, wherein the scan chain is configured to set the multiplexer to disable the bypass of the functional bits when the scan chain is in the Design-for Test mode.

6. The mixed-signal integrated circuit of claim 2, wherein the scan chain comprises an input for receiving a Functional-Scan enable signal, the Functional-Scan enable signal activating the Functional-Scan mode of the scan chain.

7. The mixed-signal integrated circuit of claim 6, wherein the digital circuit further comprises an activation circuit configured to activate the Functional-Scan mode in the scan chain upon reception of the Functional-Scan enable signal.

8. The mixed-signal integrated circuit of claim 7, wherein the activation circuit is further configured to activate the Functional-Scan mode in the scan chain once after a reset of the mixed-signal integrated circuit.

9. The mixed-signal integrated circuit of claim 6, wherein the scan chain further comprises a state machine configured to control the setting of the part of the configuration bits of the digital block.

10. The mixed-signal integrated circuit of claim 9, wherein the state machine is activated based on the Functional-Scan enable signal.

11. The mixed-signal integrated circuit of claim 6, wherein the scan chain further comprises a shift register storing data to be set to the part of the configuration bits of the digital block.

12. The mixed-signal integrated circuit of claim 11, wherein the scan chain is further configured to shift out one bit of the shift register in each operation cycle to the part of the configuration bits of the digital block.

13. The mixed-signal integrated circuit of claim 12, wherein the shift register is initialized based on the Functional-Scan enable signal.

14. The mixed-signal integrated circuit of claim 1, wherein the analog circuit comprises:
   a plurality of switched capacitors;
   a plurality of current sources;
   a plurality of voltage sources; or
   a plurality of amplifiers.

15. A method, comprising:
   scanning part of functional bits of a digital block embedded in an analog circuit with respect to a designed functionality using a scan chain, wherein the analog circuit comprises: the digital block embedded in the analog circuit, the digital block comprising a plurality of functional bits and a plurality of configuration bits, the plurality of functional bits providing for a functionality of the analog circuit according to the designed functionality and the plurality of configuration bits being usable for configuring a plurality of operational modes of the analog circuit; and a digital circuit comprising a scan chain; and
   setting part of the configuration bits of the digital block embedded in the analog circuit according to a selected operational mode of the plurality of operational modes of the analog circuit using the scan chain.

* * * * *